(12) United States Patent
Nakajima et al.

(10) Patent No.: US 6,617,691 B2
(45) Date of Patent: Sep. 9, 2003

(54) SEMICONDUCTOR DEVICE

(75) Inventors: Takashi Nakajima, Chiyoda (JP); Tomio Iwasaki, Tsukuba (JP); Hiroyuki Ohta, Tsuchiura (JP); Hideo Miura, Koshigaya (JP); Shinji Nishihara, Kokubunji (JP); Masashi Sahara, Hitachinaka (JP); Kentaro Yamada, Hitachinaka (JP); Masayuki Suzuki, Kokubunji (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/252,534

(22) Filed: Sep. 24, 2002

(65) Prior Publication Data

US 2003/0015801 A1 Jan. 23, 2003

Related U.S. Application Data

(63) Continuation of application No. 09/822,489, filed on Apr. 2, 2001, now Pat. No. 6,472,754.

(30) Foreign Application Priority Data

Mar. 31, 2000 (JP) .......................................... 2000-101195

(51) Int. Cl.[7] .............................................. H01L 23/48
(52) U.S. Cl. .......................... 257/758; 257/66; 257/296; 257/314; 257/780; 257/781; 257/785
(58) Field of Search ................................. 257/780, 781, 257/785, 296, 314, 66

(56) References Cited

U.S. PATENT DOCUMENTS

| 5,821,563 | A | 10/1998 | Yamazaki et al. | ............. 257/66 |
| 6,060,740 | A | 5/2000 | Shimizu et al. | ............. 257/314 |
| 6,207,986 | B1 | 3/2001 | Yamanaka et al. | ............. 257/296 |
| 6,384,486 | B2 * | 5/2002 | Zuniga et al. | ............. 257/781 |

FOREIGN PATENT DOCUMENTS

JP          10-144623          5/1998

* cited by examiner

Primary Examiner—David Nelms
Assistant Examiner—Mai-Huong Tran
(74) Attorney, Agent, or Firm—Antonelli, Terry, Stout & Kraus, LLP

(57) ABSTRACT

The object of the invention is to provide such a highly reliable semiconductor device as no defect such as the breakage of a tungsten conductor occurs. This object is achieved by the following means, i.e., a molybdenum film, a tungsten film and another molybdenum film are deposited in this order on an interlayer dielectric film formed on a silicon substrate.

6 Claims, 14 Drawing Sheets

SEMICONDUCTOR DEVICE

This is a continuation of application Ser. No. 09/822,489, filed Apr. 2, 2001, now U.S. Pat. No. 6,472,754 the entire disclosure of which is hereby incorporated by reference.

BACKGROUND OF THE INVENTION

The invention relates to a semiconductor device.

In semiconductor devices, the needs for larger-integration design and faster-speed design are high, and the microfabrication and faster-speed design of the devices have proceeded by the development of high-accuracy micromachining techniques, the enhancement of electrical characteristics brought about by the adoption of new materials, and the applying of new device structures, etc.

For interconnector-forming processes, as a material which withstands steps performed at a temperature higher than that in the case of aluminum alloys hitherto used and which is less apt to be broken even in a case where the width of an interconnector becomes not more than 500 nanometers, tungsten (W) has come to be used as the material for interconnectors and plugs that establish connection among the interconnectors. Techniques for forming tungsten conductors and tungsten plugs are disclosed in JP-A-10-144623, etc.

When a tungsten film is formed at a temperature not more than 500° C. by a sputtering method or a chemical vapor deposition (CVD) method, etc., this temperature is very low in comparison with the melting point of tungsten (about 3400° C.) and, therefore, many crystal defects such as vacancies and dislocations often are apt to remain within the grains of tungsten insofar as a period immediately after the film forming is concerned. The vacancies and dislocations make the states of atoms unstable and provide diffusion paths within grains. For this reason, when subjected to a heat hysteresis at a temperature not less than the film-forming temperature, the larger the number of defects such as the vacancies and dislocations, the more the tungsten atoms tend to diffuse, and consequently, the film often becomes dense and contracts in the course of the diffusion of the tungsten atoms migrating to stable locations.

Further, when a tungsten film is formed at a temperature not more than the above-mentioned 500° C., the grain size of tungsten often becomes about 50 to 200 nanometers. When fine tungsten conductors each having a width not more than 200 nano-meters are formed by performing the dry etching of the tungsten film, the tungsten conductor width and the tungsten grain size become almost equal to each other. As a result, many grain boundaries are formed in the directions crossing the tungsten conductor, so that there occurs such a structure called "bamboo structure" as grains are present in the shape of chain. Grain boundaries are one of the locations where atoms are most apt to diffuse. Thus, the interconnector of the bamboo structure is one of structures in which the breaks of the tungsten conductors are most apt to occur when the atoms diffuse actively within the tungsten conductors and when the film contraction occurs.

In a conventional tungsten conductor-forming step, the temperature of heat hysteresis after forming film was set at a temperature not more than about 500° C., and tungsten atoms were not very thermally activated, so that tungsten atoms did not diffuse actively. Besides, because the width of a tungsten conductor was larger than a tungsten grain size, the tungsten conductor was less apt to cause the bamboo structure. Accordingly, in the conventional interconnector-forming processes, the interconnectors were not broken.

However, since the width of the tungsten conductor is miniaturized to be not more than 200 nanometers, the possibility that the structure of the tungsten conductor becomes the bamboo structure is raised. Besides, in a case where a thermal load of not less than 600° C. is applied to the tungsten conductor as in the step of crystallizing amorphous tantalum oxide ($Ta_2O_5$) for forming a dielectric film of a capacitor or as in the step of oxidizing the lower electrode surface of polycrystalline silicon of the capacitor, there come to occur such cases as the tungsten conductor is broken due to the diffusion of tungsten atoms caused during such high-temperature steps. The smaller the width of the tungsten conductor and the higher the heat treatment temperature, the more the tungsten conductor breakage are apt to occur. It has been found that the tungsten conductor breaks are particularly remarkable when tungsten films are directly deposited on a silicon oxide film.

SUMMARY OF THE INVENTION

The object of the invention is to provide a semiconductor device having highly reliable tungsten conductors in which the above problems are solved and defects such as no break of the tungsten conductor occurs.

The reasons for the breakage of the tungsten conductor are as follows:

(1) Because the temperature at which the film is formed is low in comparison with the melting point of tungsten, crystal defects (unstable arrangement of atoms) such as vacancies and dislocations are apt to remain in the interior of the tungsten conductor. This tendency is especially remarkable when the tungsten interconnector is formed directly on the silicon oxide film.

(2) Because a heat hysteresis of a high temperature exceeding the film-forming temperature is applied to the sparse tungsten conductor in which many crystal defects remain, tungsten atoms are apt to diffuse also within grains in addition to the diffusions that occurs on the surfaces of the tungsten conductor and that occurs at the grain boundaries.

(3) Because the tungsten conductor width is equivalent to the grain size of tungsten or is not more than it, the tungsten conductor comes to have the bamboo structure, so that the tungsten conductor is broken even when one of the tungsten grain boundaries is opened.

To solve the above problems, there is provided a semiconductor device of the invention that has the following features.

At least one of the above problems is solved by the following constitution of the invention.

(A) To suppress the surface diffusion of tungsten atoms within the above tungsten conductor and, at the same time, to suppress the diffusion within the grains by lowering the proportion of the unstable arrangement of atoms remaining within the tungsten conductor, a molybdenum (Mo) film (a first electrically conductive film) and another molybdenum film (a third electrically conductive film) are formed, respectively, at the interface defined between the tungsten conductor (a second electrically conductive film) and an interlayer dielectric film (a first dielectric layer), which serves as an underlayer, and on the surface side of the tungsten conductor, whereby the tungsten conductor is sandwiched between the two molybdenum films.

Molybdenum has a melting point lower than that of tungsten although it has a lattice structure similar to that of tungsten. Therefore, crystal defects are less apt to occur in molybdenum than in tungsten. When a molybdenum film having this characteristic is used as the underlayer of the tungsten conductor, tungsten atoms deposit along the arrangement of tungsten atoms of the underlayer, so that a dense tungsten film having few crystal defects can be easily obtained. For this reason, even in a case where the tungsten conductor undergoes a heat hysteresis of a temperature not less than 500° C. at a later step, the diffusion within the grains or at the grain boundaries is suppressed and no breakage occurs in the tungsten conductor.

(B) To prevent the bamboo structure of the tungsten conductor from occurring, a molybdenum film (a fourth electrically conductive film) is formed so that it may partition the tungsten conductor into at least two layers (the second electrically conductive film and a fifth electrically conductive film) in the direction of the film thickness.

The tungsten conductor comes to have a two-layer structure, so that the probability of occurrence of tungsten conductor breakage becomes very low even if the breakage at grain boundary occurs in the tungsten conductor of the first film, because electrical connection is established by the other film.

(C) To suppress the surface diffusion of tungsten atoms within the tungsten conductor, a molybdenum film (a sixth electrically conductive film) and another molybdenum film (a seventh electrically conductive film) are formed at the interface defined between the tungsten conductor (the second electrically conductive film) and the underlayer, and on the surface side of the tungsten conductor, respectively, whereby the tungsten conductor comes to be covered with the molybdenum films.

By making the surface, interface and side of the tungsten conductor be in contact with molybdenum having a lattice space similar to that of tungsten, the surface diffusion is suppressed and no grain-boundary break of a tungsten wire comes to occur.

Incidentally, in the above features of the invention (A), (B) and (C), it is not always necessary that the molybdenum films be made of pure molybdenum, that is, they may be films made of a material having a lattice space similar to that of tungsten, and the use of any material having the effect of suppressing the diffusion of tungsten atoms is usable. The films may be made of, for example, any one of pure molybdenum containing not less than 99% Mo by atomic ratio, a molybdenum alloy containing not less than 90% Mo by atomic ratio, molybdenum nitride containing not less than 40% Mo by atomic ratio, molybdenum carbide containing not less than 40% Mo by atomic ratio, molybdenum boride containing not less than 40% Mo by atomic ratio, tungsten nitride containing not less than 40% W by atomic ratio, tungsten carbide containing not less than 40% W by atomic ratio, and tungsten boride containing not less than 40% W by atomic ratio.

The reliability against the breakage of the tungsten conductor is greatly improved by providing a semiconductor device having the above features.

Before the embodiments of the invention are described, the following terms used in this specification are explained.

"The Main Element"

The "main element" used in this specification is defined to be an "element having the highest ratio of the number of atoms in a material." The property of this "main element" often determines the main property of an obtained material.

"The Main Component"

In a compound material, when the ratio of the number of atoms of a plurality of elements, which constitute the particular compound, to the total number of atoms regarding a plurality of elements (including impurities and additives) constituting the whole of the material is the highest, the particular compound is defined as the "main component" in this specification.

DETAILED DESCRIPTION OF THE PREFERRED EMBODIMENTS

Figure 1:
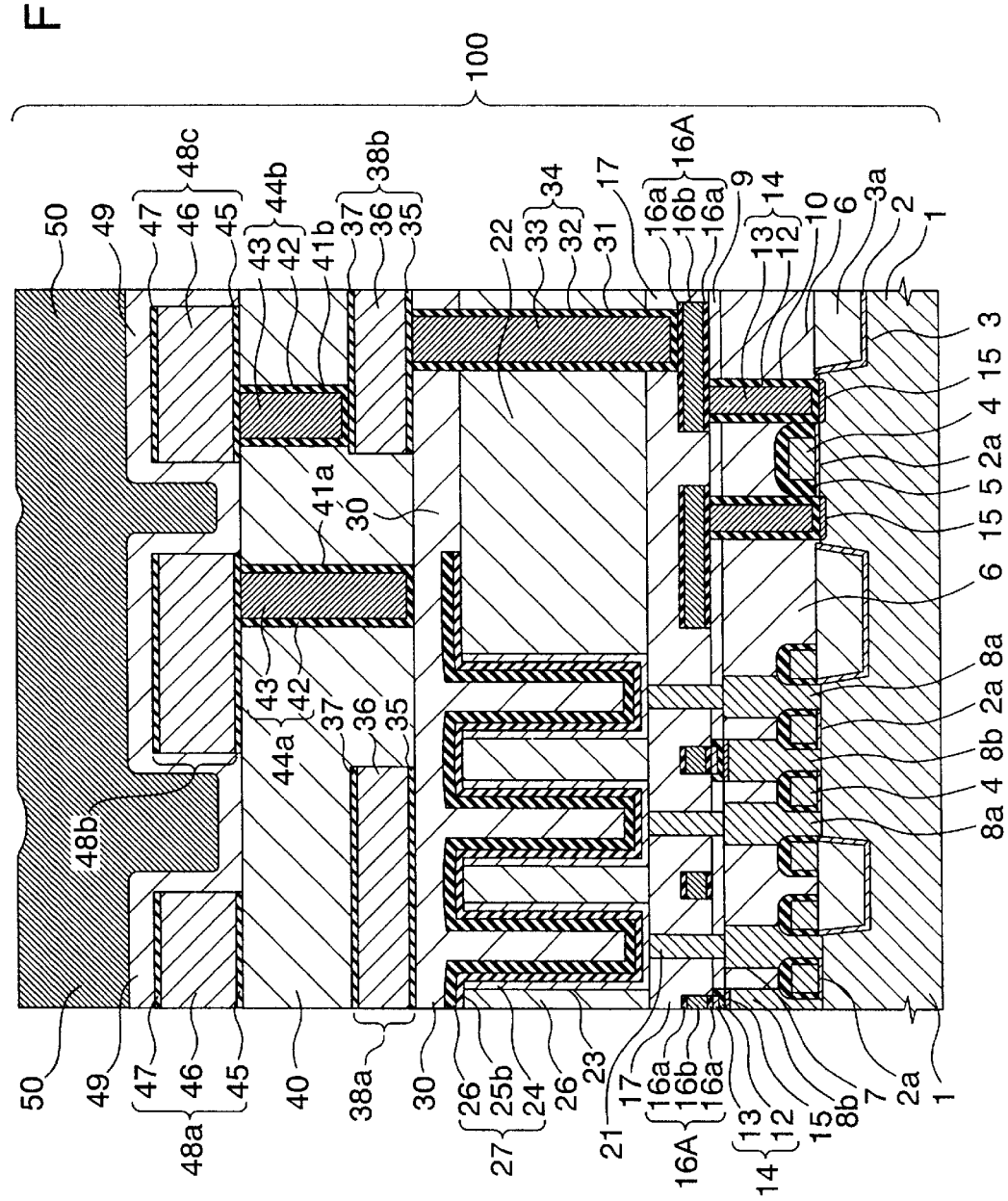
FIG. 1 is a schematic sectional view of a semiconductor device related to one embodiment of the invention.

One embodiment related to the invention is shown in FIG. 1. FIG. 1 is a schematic sectional view of a semiconductor device 100 of this embodiment in a case where the device is applied to a semiconductor memory. The left side of the figure shows the structure of a memory cell portion, and the right side of the figure shows the structure of a peripheral circuit portion.

On a silicon substrate are formed gate electrodes 4, first-layer interconnector 16A, second-layer interconnectors 38a, 38b which are formed by laminating an aluminum alloy film 36 and high-melting material films 35, 37, third-layer interconnectors 48a, 48b, 48c which are formed by laminating an aluminum alloy film 46 and high-melting material films 45, 47, a passivated film 50 for preventing humidity and the like from entering the interior of a semiconductor chip. On the side of the memory cell portion, a capacitor 27 is formed between the first-layer interconnector and the second-layer interconnector.

In a case where the first-layer interconnector 16A is formed of a single-layer tungsten film, the bamboo structure is formed when it is worked to have a width not more than 200 nanometers, so that, when a thermal load not less than 600° C. is added later, tungsten atoms diffuse and interconnector breaks at grain boundaries are apt to occur.

In the semiconductor device 100 shown in FIG. 1, the first-layer interconnector 16A has a three-layer structure in which a tungsten film 16b is sandwiched between two molybdenum films 16a. In this Mo/W/Mo layered interconnector, the tungsten film becomes dense because of the presence of the underlayers of the molybdenum films and, at the same time, the surface diffusion is suppressed because both of the substrate-side interface and surface side of the tungsten film is in contact with the molybdenum films. Therefore, the interconnector break at grain boundaries hardly occurs even when a thermal load not less than 600° C. is applied to the first-layer interconnector 16A having a interconnector width not more than 200 nanometers.

Figure 2:
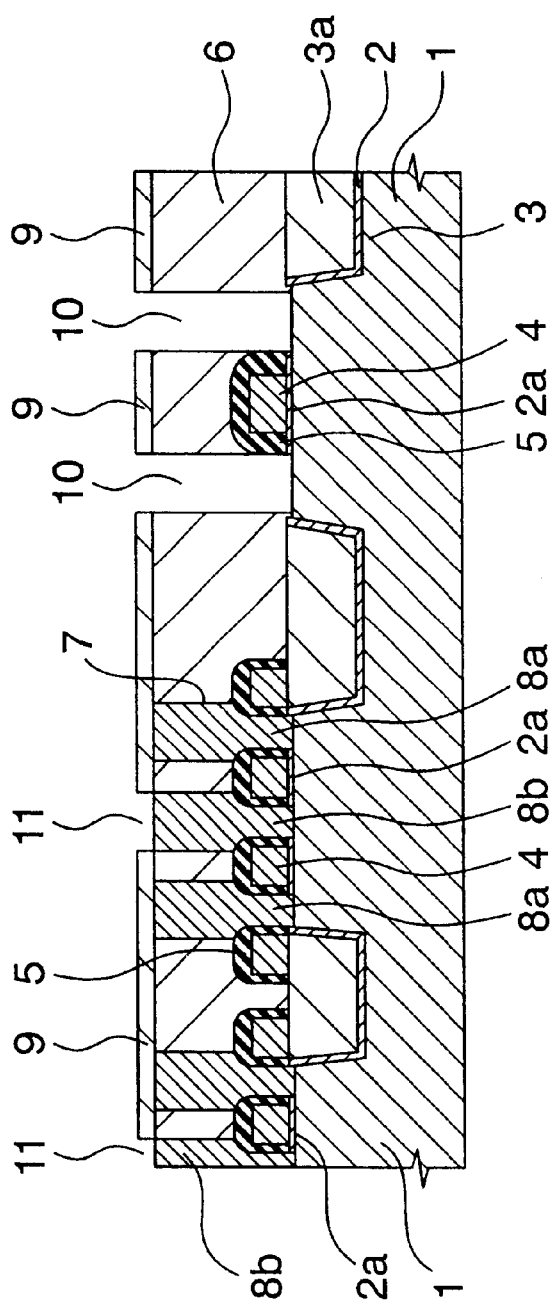
FIG. 2 is a schematic sectional view of a first step of a method for producing the semiconductor device related to the embodiment of the invention.

FIG. 2 to FIG. 8 are schematic sectional views of the steps of producing the semiconductor memory relating to the embodiment. FIG. 2 schematically shows a section of the device at the stage of forming a contact hole 10 and a through hole 11 for obtaining electrical continuity after the steps of forming of an MOS (metal-oxide-semiconductor) transistor on a silicon substrate 1 and depositing interlayer dielectric films 6, 9.

Then, shallow trenches 3 for separating elements are formed in the silicon substrate 1, a silicon oxide film 2 being formed on the surface of the trenches, a silicon oxide film 3a being embedded in the shallow trenches 3, a gate oxide film 2a being formed, gate electrodes 4 and a silicon nitride film 5 covering the gate electrodes 4 being formed, impurities being added into the interior of the silicon substrate 1, the interlayer dielectric film 6 being formed, polycrystalline silicon plugs 8a, 8b being embedded in the contact holes 7, the interlayer dielectric film 9 being formed, and the contact holes 10 and through holes 11 are formed.

Figure 3:
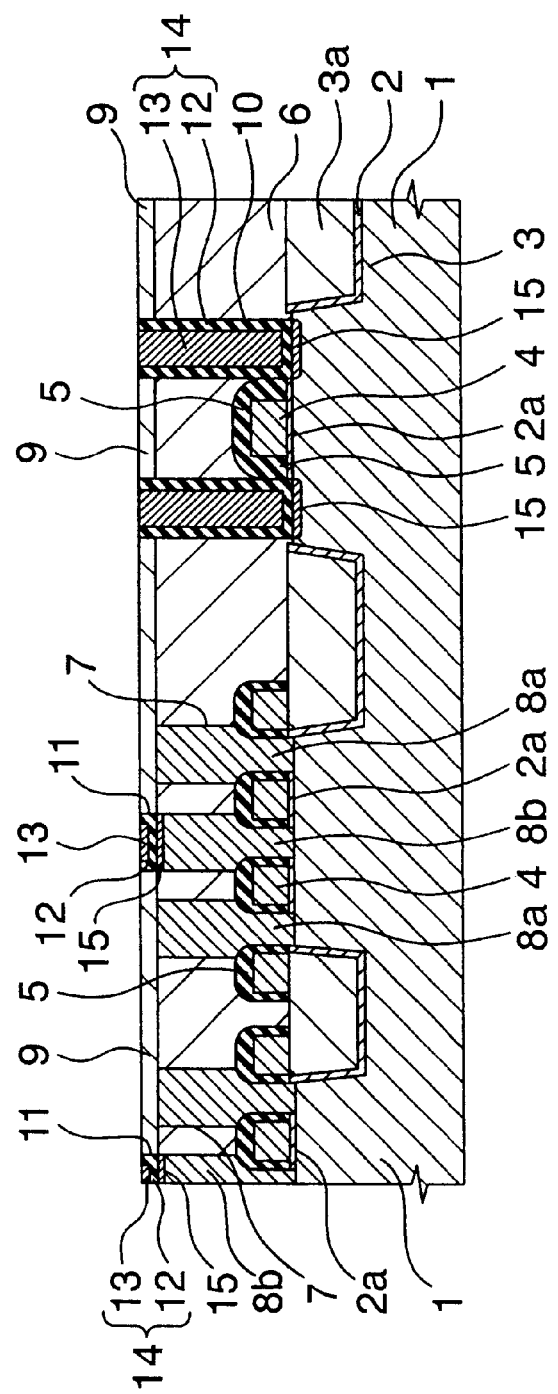
FIG. 3 is a schematic sectional view of a second step of the method for producing the semiconductor device related to the embodiment of the invention.

In FIG. 3, to prevent the contamination of the silicon substrate by heavy metals coming from the interconnectors and the like, high-melting point material films 12 used as barrier films are formed within the contact holes 10 and the through holes 11. The high-melting point material films 12 are formed by depositing and laminating, for example, a titanium (Ti) film with a thickness of 10 nm and a titanium nitride (TiN) film with a thickness of 100 nm by use of a sputtering method or a CVD method. At the interfaces each defined between the high-melting point material film 12, the silicon substrate 1 and the polycrystalline silicon plug 8b are formed silicide layers 15 brought about by a chemical reaction in a heat treatment step that is added later. For example, titanium silicide layers are formed when the high-melting point material film 12 has a layered structure of a Ti film and a TiN film, and cobalt silicide layers are formed when the high-melting point material film 12 has a layered structure of a cobalt film and a TiN film.

After forming the high-melting point material film 12, a tungsten film 13 is deposited by a chemical vapor deposition (CVD) method, and the tungsten film 13 is embedded in the contact holes to thereby form a tungsten plug 14. The high-melting point material film 12 and tungsten film 13 deposited on the interlayer dielectric film 9 are polished and removed by a chemical mechanical polishing (CMP) method with the tungsten plug 14 alone kept remaining, and the surface of the interlayer dielectric film 9 is flattened.

Figure 4:
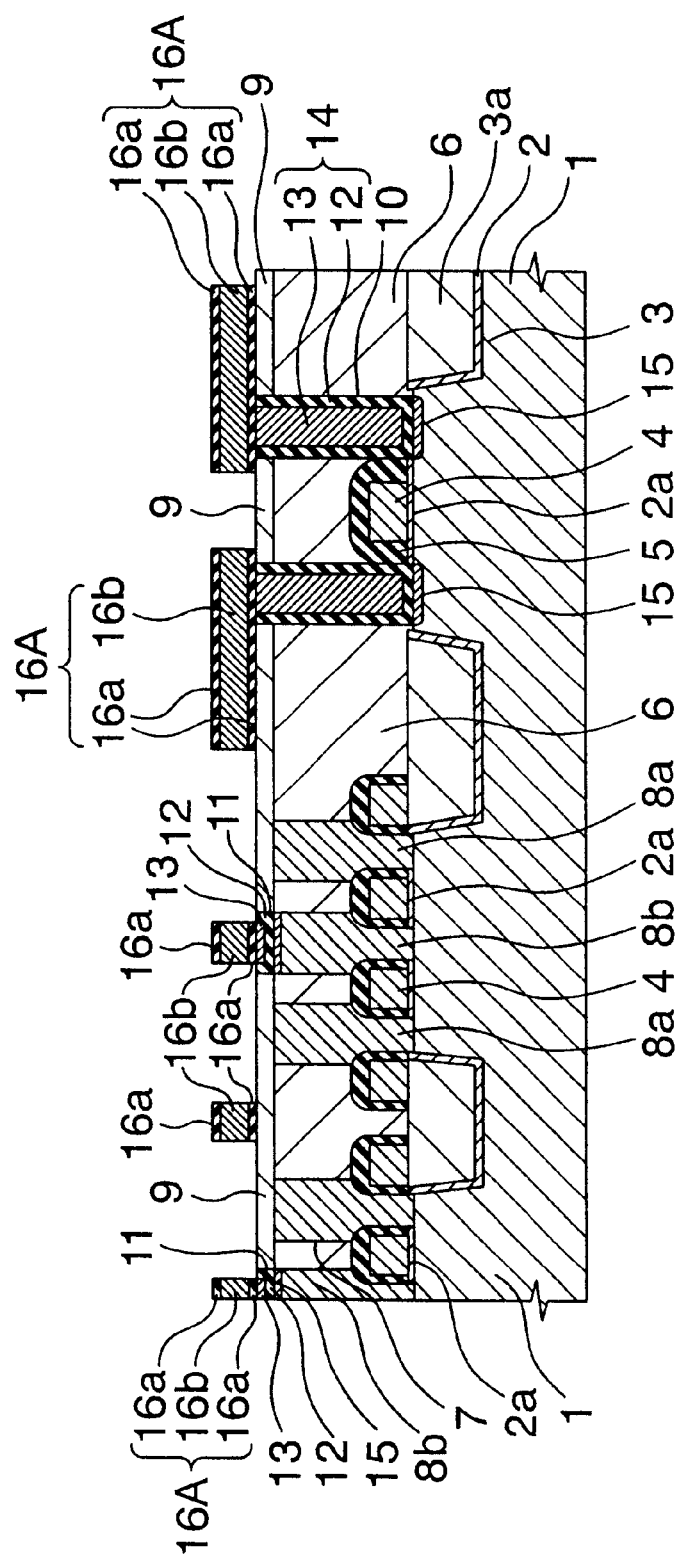
FIG. 4 is a schematic sectional view of a third step of the method of producing the semiconductor device related to the embodiment of the invention.

In FIG. 4, on the interlayer dielectric film 9, the molybdenum film 16a, the tungsten film 16b and the molybdenum film 16a are formed through a sputtering method or a CVD method. The thicknesses of the deposited films are such that, for example, the molybdenum film 16a is 10 nm, the tungsten film 16b is 100 nm and the molybdenum film 16a is 10 nm. Because the resistance of a molybdenum film is as low as that of a tungsten film, the Mo/W/Mo layered structure is superior in electrical properties to a TiN/W/TiN structure in which each of the titanium nitride (TiN) films is formed at the interface defined by each of the interlayer dielectric films. Therefore, the smaller the interconnector width, the more this structure is effective.

The methods of depositing the tungsten and molybdenum films are described below. In the sputtering method, atoms are physically sputtered from a target by using the cations of a noble gase such as argon and are deposited on a wafer. Therefore, this method has the advantages of excellent adhesion to an underlayer and a high film-forming rate. Conversely, when a film is to be deposited in the interior of a deep trench, the thickness of a film adhering to the side of the trench becomes smaller than that of a film adhering to the bottom of the trench, thus causing a disadvantage. On the other-hand, when a film is deposited by the CVD method, the film relatively uniformly adheres to both the side and bottom of the trench although the adhesion to the underlayer tends to be weak in comparison with the sputtering method. Therefore, the CVD method is suitable for a case where a film is embedded in the interior of a deep trench or a hole. Both methods have their advantages and disadvantages and, therefore, films can be deposited by making use of the advantages while taking device structures and film stresses etc. into consideration.

As regards a film-forming temperature, the higher the film forming temperature, the denser the tungsten film 16b becomes, and the lower electrical resistance becomes, with the result that the tungsten film 16b can be used as narrower interconnectors. Incidentally, at this film-forming stage, the first-layer interconnector 16A may be beforehand subjected, in a vacuum, to a heat treatment of the same temperature as a heat hysteresis to be added layer, whereby the Mo/W/Mo layered interconnectors become denser and the interconnectors become less apt to be broken.

As regards a film-forming rate, in a case where a tungsten film-forming rate decreases, individual tungsten atoms that fly onto a wafer can migrate to more stable locations, so that the tungsten becomes denser and, therefore, interconnectors become less apt to be broken.

Next, the layered interconnector 16A having a width not more than 0.2 $\mu$m is formed by the dry etching of the Mo/W/Mo layered film. The surface of the interlayer dielectric film 9, which is the underlayer of the first-layer interconnector 16A, is polished and planated by the CMP and, therefore, this permits the exposure of a high-accuracy and fine interconnector circuit.

Figure 10:
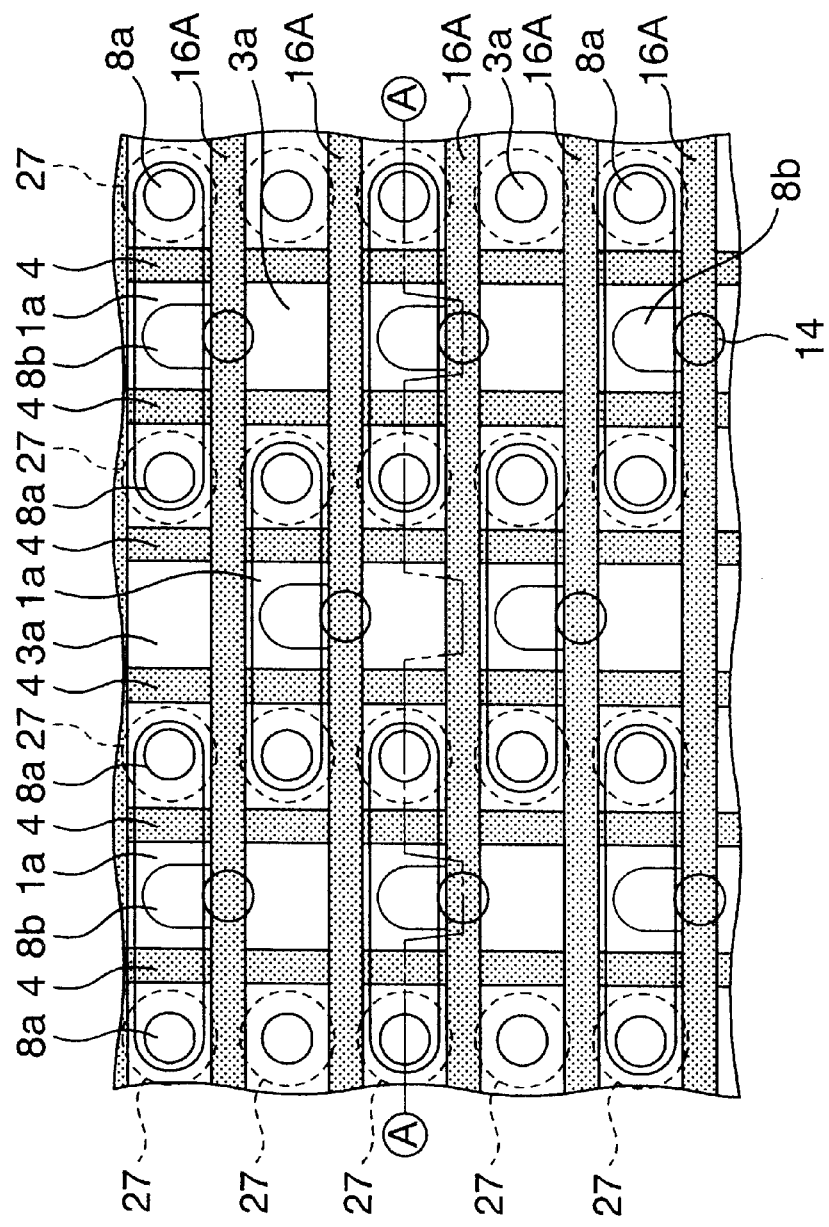
FIG. 10 is a plan view of a portion including gate electrodes and W conductors of the semiconductor device related to the embodiment of the invention.

A plan arrangement of the device is explained below by referring to FIG. 10. In the figure, the layers extending in a vertical direction are the gate electrodes 4, and each of the W conductors 16A is located in the space defined between the polycrystalline silicon plugs 8a and extends in a direction vertical to the gate electrodes. The sectional views disclosed above are ones obtained by taking cross sections along the line A—A in the plan view. Each of the transistors is formed in a region 1a formed like an island on the surface of the silicon substrate 1, and each of the shallow trenches 3 around the regions 1a is embedded with the silicon oxide film 3a. Electrical signals from this regions 1a in each of which the transistor is formed are taken out through the polycrystalline silicon plugs 8a, 8b. Onto each of the polycrystalline silicon plugs 8b is further connected a tungsten plug 14, which is in turn connected to the tungsten conductor. Each of capacitors 27 is connected to the polycrystalline silicon plug 8a.

Figure 14:
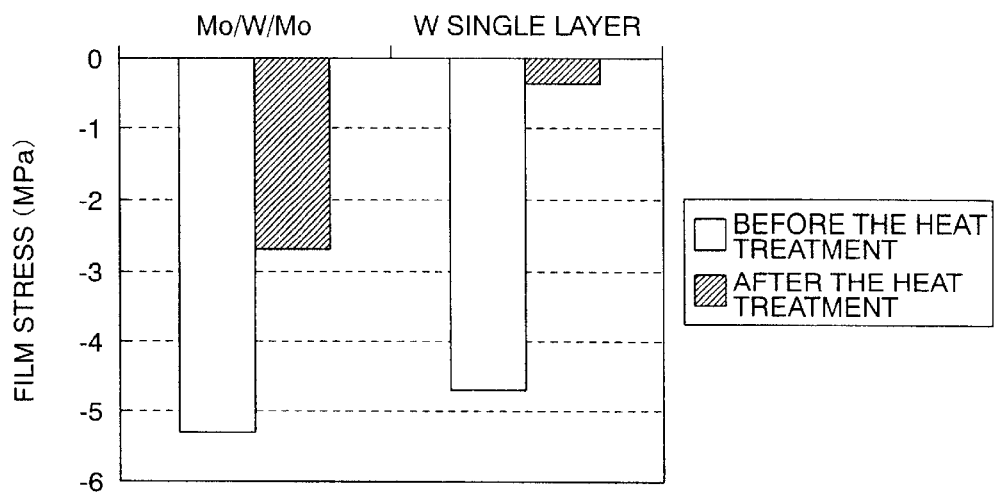
FIG. 14 is a graph showing the film structure dependence of the amount of stress variation in a case where a heat treatment at 1000° C. is performed for 10 minutes.

FIG. 14 shows examples of variations of residual stresses occurring in the film in cases where a sample obtained by sputtering a single-layer tungsten film on a silicon oxide film and another sample obtained by depositing an Mo/W/Mo layered film were subjected to a heat treatment at 1000° C. The thickness of each of the films deposited on each of the samples was such that the tungsten film was 100 nm, and in the Mo/W/Mo layered film the molybdenum film was 5 nm, the tungsten film was 95 nm, and the molybdenum film was 5 nm. Incidentally, it was ascertained that, because the molybdenum film was as thin as 5 nm, the stress variation of the single layer of molybdenum before and after the heat treatment was very small in comparison with the stress variation of the whole Mo/W/Mo structure.

Before the forming of the films, large compressive stresses of about 5 GPa occurred in both structures, and the measured samples were warped into a convex shape with their film-deposited sides facing upward. However, after the heat treatment at 1000° C., the film stress in the structure of the single tungsten layer decreased to about one-tenth of the initial stress value. It is thought that the film was contracted abruptly, resulting in the generation of a stress variation corresponding to a tensile stress of about 4 GPa. In the Mo/W/Mo structure, the stress decreases down to about 2.7 GPa due to the heat treatment at 1000° C., however, it is found that the stress variation becomes very small in comparison with the structure of single tungsten layer.

This shows that the larger the variation of the film stress, the sparser the original film, with the result that during heat treatment, the film becomes dense and contracts. Conversely, in the Mo/W/Mo structure, the film is thought to become denser than the tungsten film of the single layer because of the effect of the underlayer of the molybdenum film. From the respects, it is thought that the film of the single tungsten layer is sparser and that in the Mo/W/Mo layered film structure, the two upper and lower molybdenum layers provide the effects of the underlayer and of suppressing surface diffusion.

Figure 15:
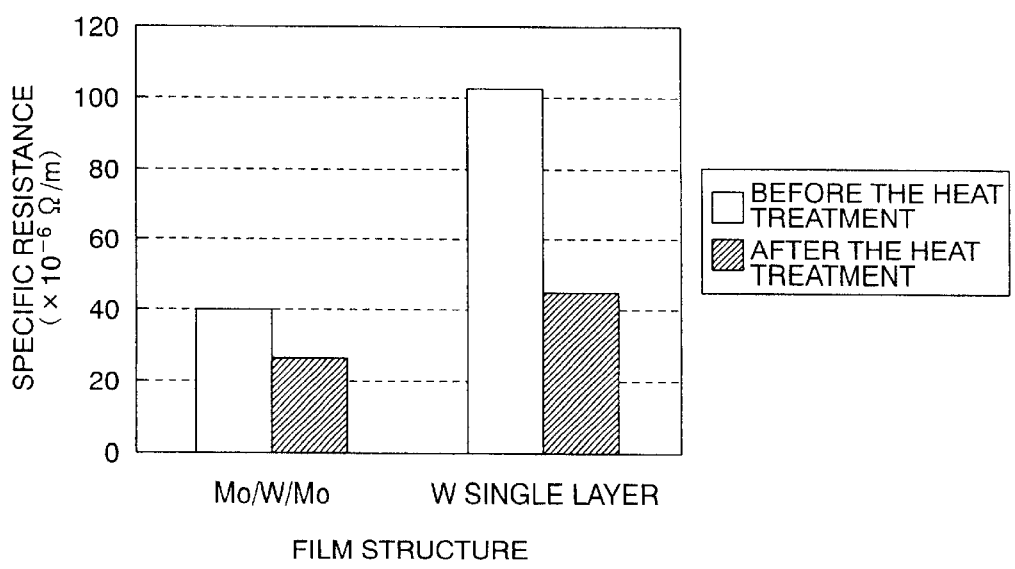
FIG. 15 is a graph showing the film structure dependence of the amount of specific resistance variation of a tungsten film in a case where heat treatment at 1000° C. is performed for 10 minutes.

For the above structure of the single tungsten layer and the Mo/W/Mo layered structure, FIG. 15 shows examples of variation of the specific resistance before and after heat treatment. In the figure, the ordinate indicates the specific resistance. In the sputtered single-layer tungsten film, the specific resistance is not less than $100 \times 10^{-6}$ ($\Omega$/m) and this value is not less than 20 times higher than the specific resistance of the tungsten balk, which is $4.9 \times 10^{-6}$ ($\Omega$/m). It is found that the property of the film becomes such that currents are less apt to flow because of many crystal defects and dislocations included therein. In the case of the Mo/W/Mo layered structure, the specific resistance is about $40 \times 10^{-6}$ ($\Omega$/m), which is not more than 40% of the specific resistance of the single-layer tungsten film, and it is found that the crystallizability of the tungsten film is improved by the presence of the molybdenum layers used as the underlayer. When comparing the specific resistance before and after the heat treatment at 1000° C., the specific resistance of the Mo/W/Mo layered film decreases about 30% after the heat treatment, whereas in the case of the single-layer tungsten film the specific resistance decreases greatly down to one-half or more. Similarly to the results of the variations of the film stresses shown in FIG. 14, from the changes in specific resistance, it is also found that the single-layer tungsten film is sparse, whereas the Mo/W/Mo layered film is denser and hence is less apt to change when subjected to heat treatment.

Figure 11:
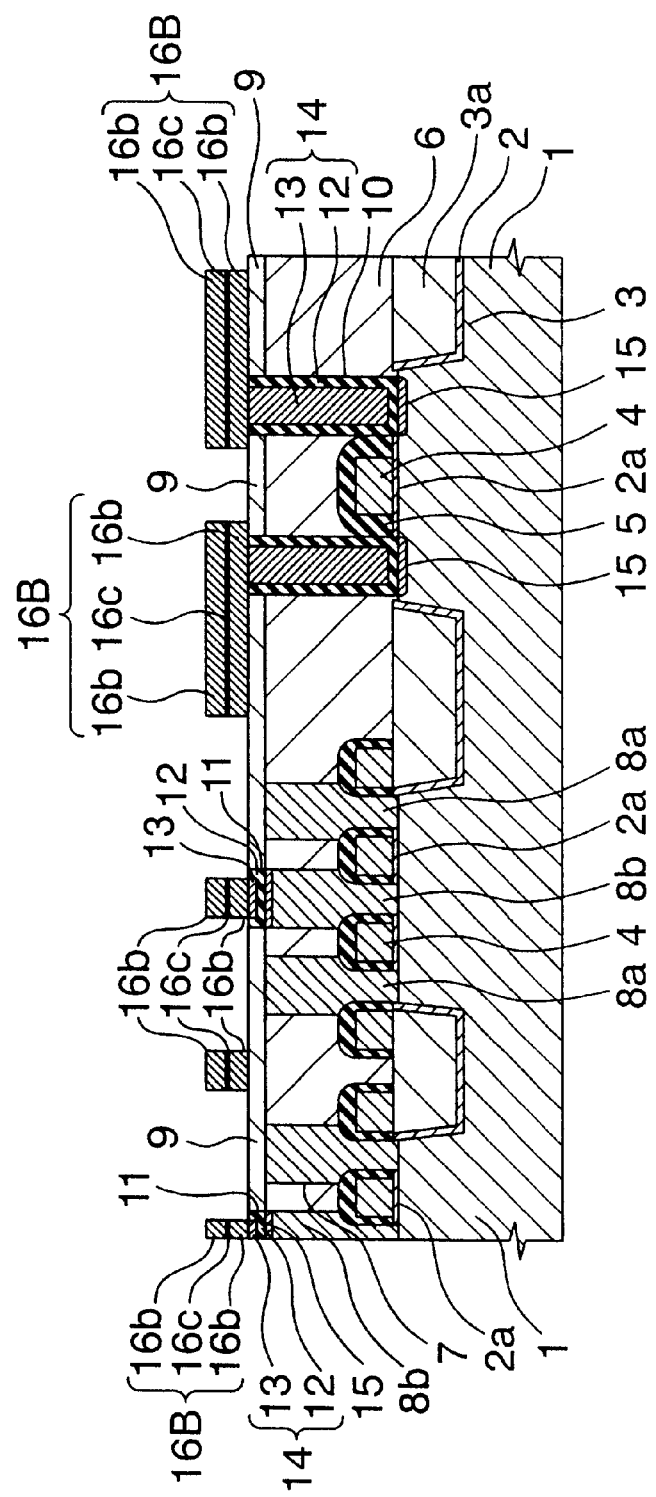
FIG. 11 is a sectional view of another semiconductor device related to another embodiment of the invention.
Figure 12:
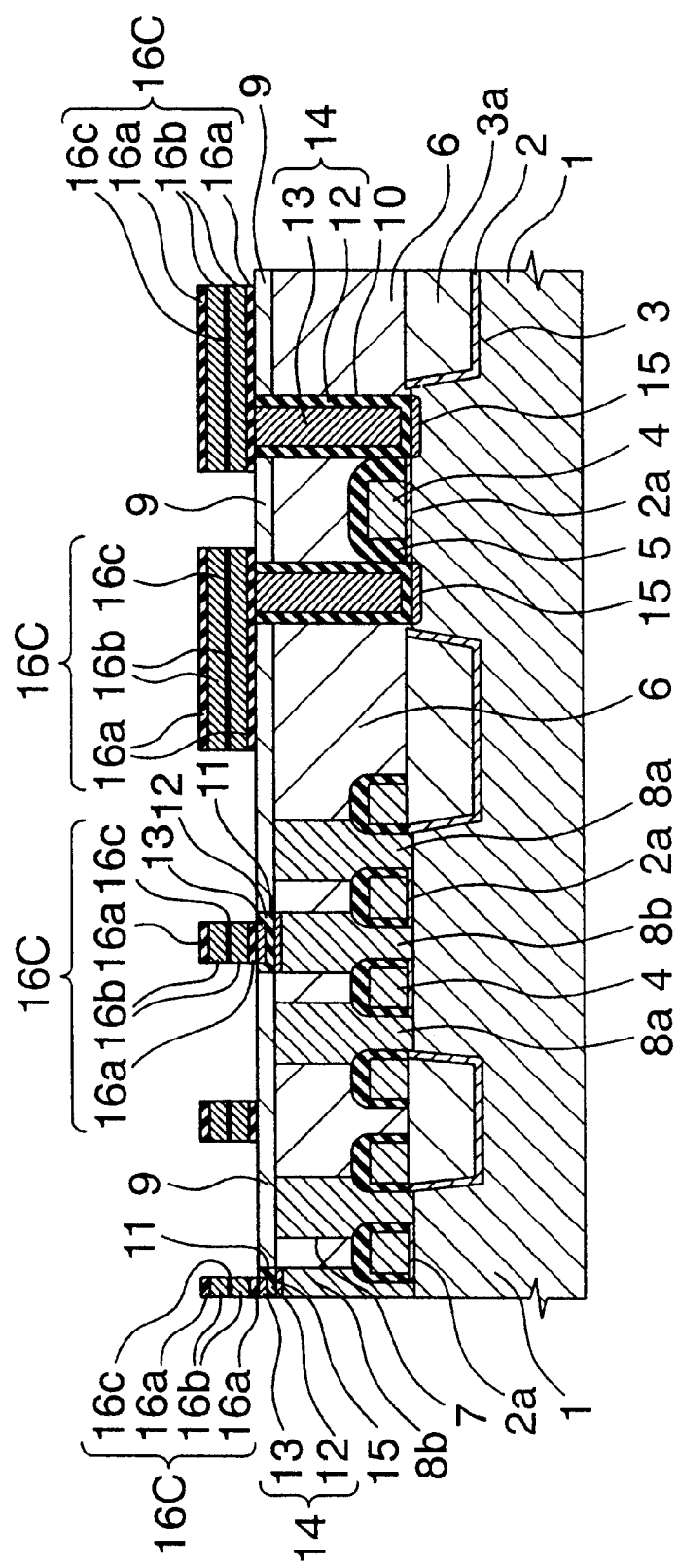
FIG. 12 is a sectional view of a semiconductor device in which the structures shown in FIG. 4 and FIG. 11 are provided.
Figure 13:
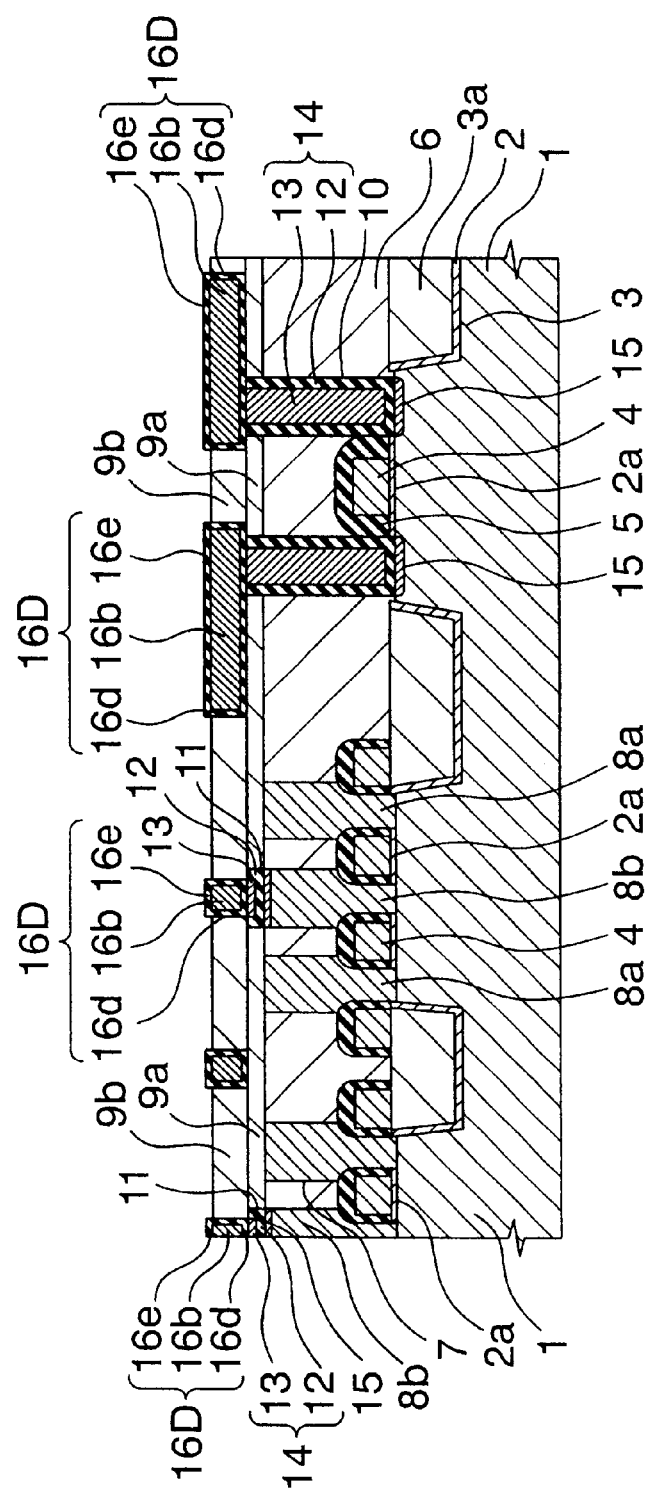
FIG. 13 is a sectional view of a semiconductor device related to a still another embodiment of the invention.

Other structures of the first-layer interconnector made of a material containing tungsten are described by referring to FIG. 11 to FIG. 13.

In FIG. 11, the tungsten film 16b has a W/Mo/W three-layer structure 16B in which a thin molybdenum film 16c is interposed in the middle of the tungsten film 16b so that the tungsten film may be divided into two layers. Each layer is deposited by the sputtering method or the CVD method, and the layer thicknesses are such that, for example, the lower-layer of the tungsten film 16b is 40 nm, the middle molybdenum layer 16c being 10 nm, and the upper-layer tungsten layer 16b is 60 nm. Because of the presence of the thin molybdenum layer 16c for dividing the tungsten film in the middle thereof, the tungsten grains within the first-layer interconnector 16B are divided into at least two upper and lower portions of the interconnector and this layered structure becomes different from the bamboo structure. In this layered structure, therefore, even when interconnector break at grain-boundaries occurs in either one of the upper and lower layers, this does not lead to any break of the interconnector as a whole. Thus, this layered structure comes to have a high reliability.

In FIG. 12, the first-layer interconnector has such a structure 16C as a Mo/W/Mo layered structure in which a tungsten layer 16b is sandwiched between two molybdenum layers 16a has a thin molybdenum layer 16c for dividing the tungsten layer 16b in the direction of the film thickness. Therefore, the interconnector structure 16C has a higher reliability than in FIG. 4 and FIG. 11 because of the effect of the dense tungsten layer 16b brought about from the presence of the molybdenum layer 16a used as the underlayer, the surface diffusion suppressing effect brought about from the contact of the upper and lower interfaces of the tungsten layer 16b with the molybdenum layer 16c, and the effect of the division of the tungsten layer 16b into the upper and lower layers.

Still another interconnector structure 16D is described below while referring to FIG. 13. In this structure 16D, a tungsten layer 16b becomes dense because a molybdenum layer 16d is formed at the interface of the underlayer of the tungsten film 16b, and surface diffusion is most suppressed because a molybdenum layer 16d and another molybdenum layer 16e are formed at the interfaces surrounding the tungsten layer 16b.

The manufacturing process of the interconnector structure 16D is described below. Trenches are first formed in an interlayer dielectric film 9b, a thin molybdenum layer 16d being then deposited in concave shape along the interior of each of the trenches, and the tungsten layer 16b is deposited so that the concave portions of the molybdenum layer 16d are embedded with the tungsten layer 16b. The thicknesses of the deposited layers are such that, for example, the molybdenum layer 16d is 10 nm and the tungsten layer is 200 nm. Next, the tungsten layer 16b and molybdenum layer 16d that are deposited in portions other than the interiors of the interlayer dielectric film 9 are polished and removed by CMP, whereby a structure is formed in which the molybdenum layer 16d and tungsten layer 16b are embedded in the interior of each of the trenches formed in the interlayer dielectric film 9. Finally, the molybdenum layer 16e is deposited and etching is performed in a manner that only the surface portions of the molybdenum layer 16d and tungsten layer 16b are made to remain, whereby the interconnector structure is formed in which, as shown in FIG. 13, the tungsten layer 16b is covered with the molybdenum layers 16d and 16e.

Figure 5:
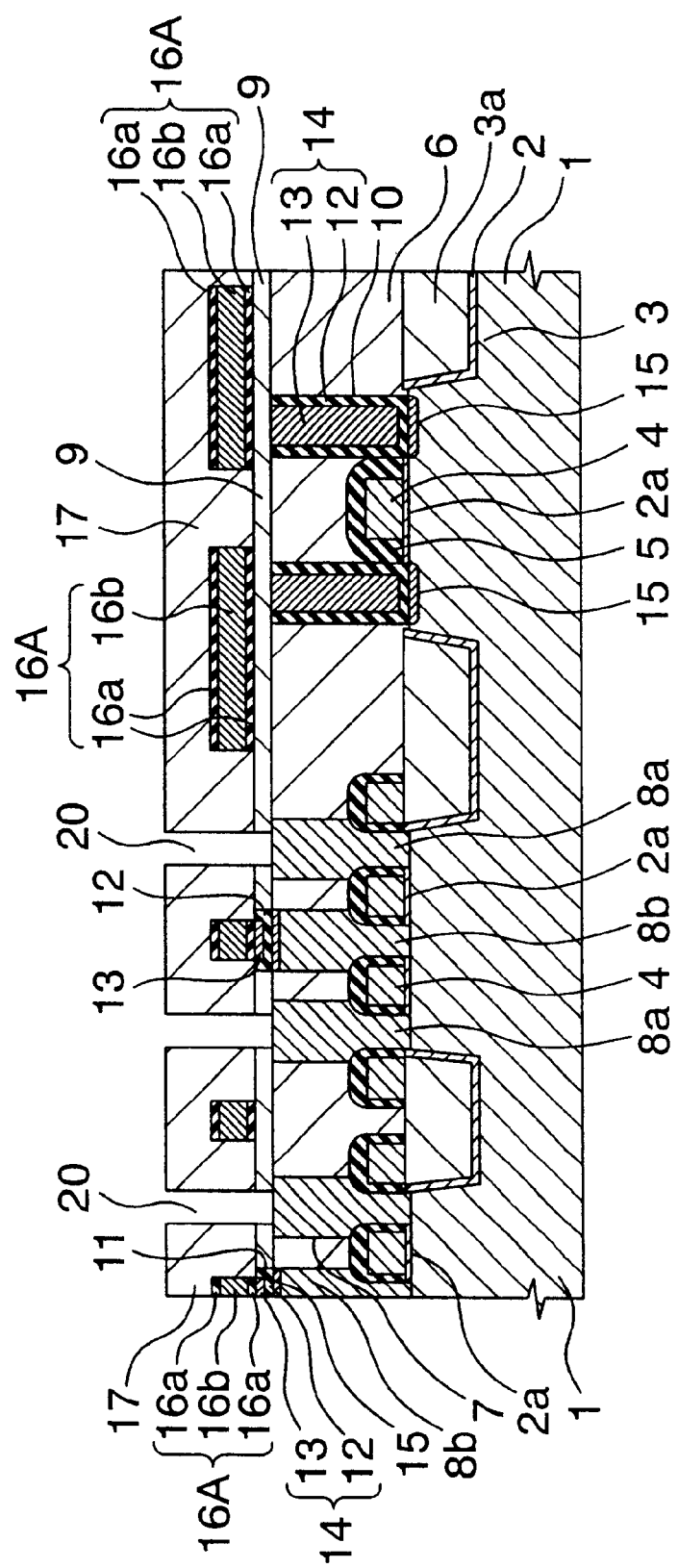
FIG. 5 is a schematic sectional view of a fourth step of the method of producing the semiconductor device related to the embodiment of the invention.

Next, the step of FIG. 5 that follows the step of FIG. 4 is described below. A interlayer dielectric film 17 is formed on the Mo/W/Mo layered interconnector 16A. When the interlayer dielectric film 17 is made to be a layered structure, a layer-forming step is repeated by the same times as the number of the laminated layers. A through hole 20 for a capacitor of the interlayer dielectric film 17 is formed so that it may be disposed in the middle of the Mo/W/Mo layered interconnector 16A.

Figure 6:
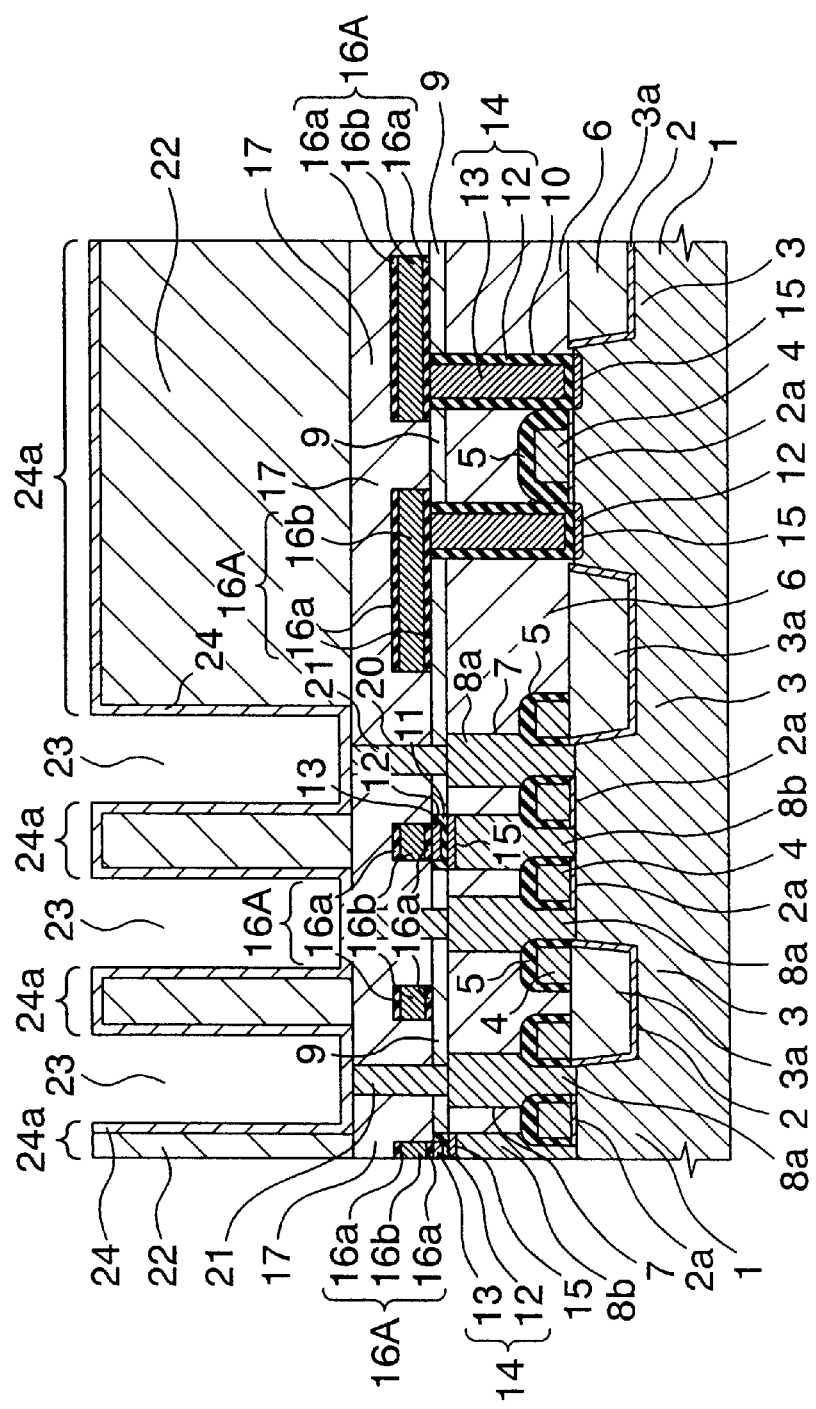
FIG. 6 is a schematic sectional view of a fifth step of the method of producing the semiconductor device related to the embodiment of the invention.

In FIG. 6, a polycrystalline silicon film is embedded in the formed through hole 20, the polishing and removal of the polycrystalline silicon film on the interlayer dielectric film 17 and the planarization of the surface of the interlayer dielectric film 17 are performed through the CPM process, whereby a polycrystalline silicon plug 21 is formed. Next, an interlayer dielectric film 22 is formed, trenches 23 for a capacitor being formed by dry etching, and a polycrystalline silicon film 24, which serves as lower electrodes of the capacitor, is formed along the interior of each of the trenches for a capacitor.

In this case, the lower electrodes may be formed of an electrically conductive material other than the polycrystalline silicon film 24, and high-melting metals, such as platinum and ruthenium, and electrically conductive metal compounds, such as TiN, tantalum nitride (TaN), ruthenium oxide (RuO) and iridium oxide (IrO), may be used because they suffer very little degradation in heat resistance and oxidation resistance even when high-temperature treatment is performed after the succeeding forming of a dielectric film for a capacitor.

Figure 7:
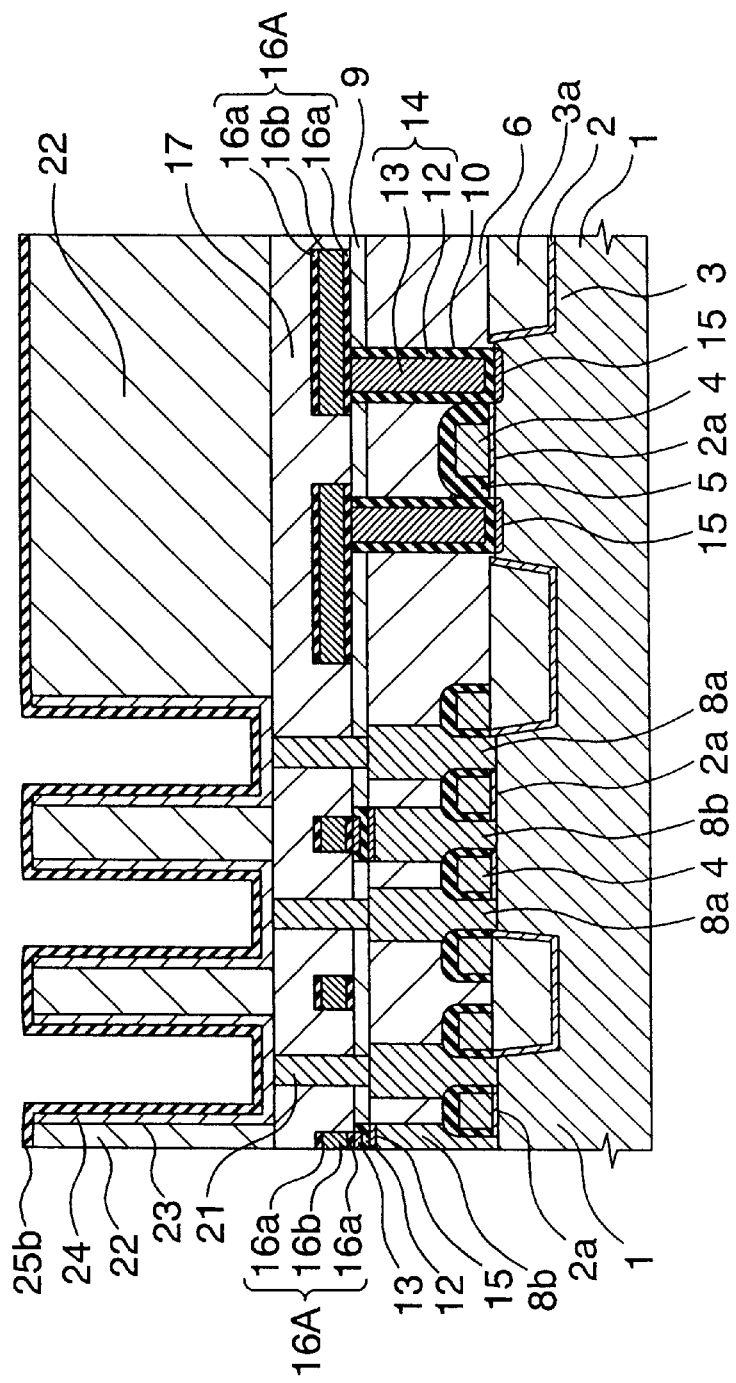
FIG. 7 is a schematic sectional view of a sixth step of the method of producing the semiconductor device related to the embodiment of the invention.

In FIG. 7, a polycrystalline silicon film 24a on the interlayer dielectric film 22 is first polished by a CMP or the polycrystalline silicon film 24a is subjected to dry etching by embedding a resist in the trench 23 for a capacitor and the resist is removed by ashing, etc., whereby the lower electrodes 24 made of polycrystalline silicon is separated in cup shape. Next, a tantalum oxide ($Ta_2O_5$) film 25a is deposited in an amorphous state with a thickness of 20 nm and the amorphous $Ta_2O_5$ is crystallized by heat treatment at 700° C. to form a polycrystalline $Ta_2O_5$ film 25b.

Although this step of heat treatment at 700° C. is indispensable for giving the polycrystalline $Ta_2O_5$ film 25b a dielectric constant that meets product specifications, a large thermal load is applied, during this step, to the first-layer interconnector 16A formed beforehand. When the first-layer interconnector 16A is a single tungsten layer, tungsten atoms diffuse and tungsten grain boundaries are opened, with the result that the interconnector break becomes apt to occur in the tungsten conductor. However, the break of the first-layer interconnector 16A is prevented by making the first-layer interconnector 16A have the three-layer structure of molybdenum layer 16a, tungsten layer 16b and molybdenum layer 16a. Therefore, because no interconnector break occurs even when the first-layer interconnector 16A is worked to a narrower interconnector with a width not more than 200 nm, it is possible to provide a high-reliability semiconductor device 100. Furthermore, a cost reduction by an improvement in the yield of the semiconductor device 100 can be expected.

In the above embodiment, $Ta_2O_5$ is used as the material for the dielectric film of the capacitor. However, because the object of the invention is to provide a highly integrated semiconductor device, the material for the dielectric film is not limited to $Ta_2O_5$, and materials having a larger dielectric factor than that of silicon oxide can be used. The dielectric film of the capacitor may be formed of a material selected, as the main component, for example, from silicon nitride ($Si_3N_4$), titanium oxide ($TiO_2$), strontium-bismuth-tantalum oxide ($SrBi_2Ta_2O_9$:SBT), strontium titanate ($SiTiO_3$: STO), barium titanate-strontium ( $(Ba_xSr_{1-x})TiO3$:BST), and lead zirconate titanate ($Pb(Zr_xTiO_{1-x})O3$:PZT). In the above materials, the final atomic ratio may sometimes differ depending on a difference in the process of forming the films. However, these materials may be used insofar as the dielectric constant thereof not less than 5 is concerned.

Moreover, it is not necessary that the high temperature step in which a temperature not less than 600° C. is used be the step of forming the dielectric film, and other processes in which a temperature not less than 600° C. is used to form other films may be included.

Figure 8:
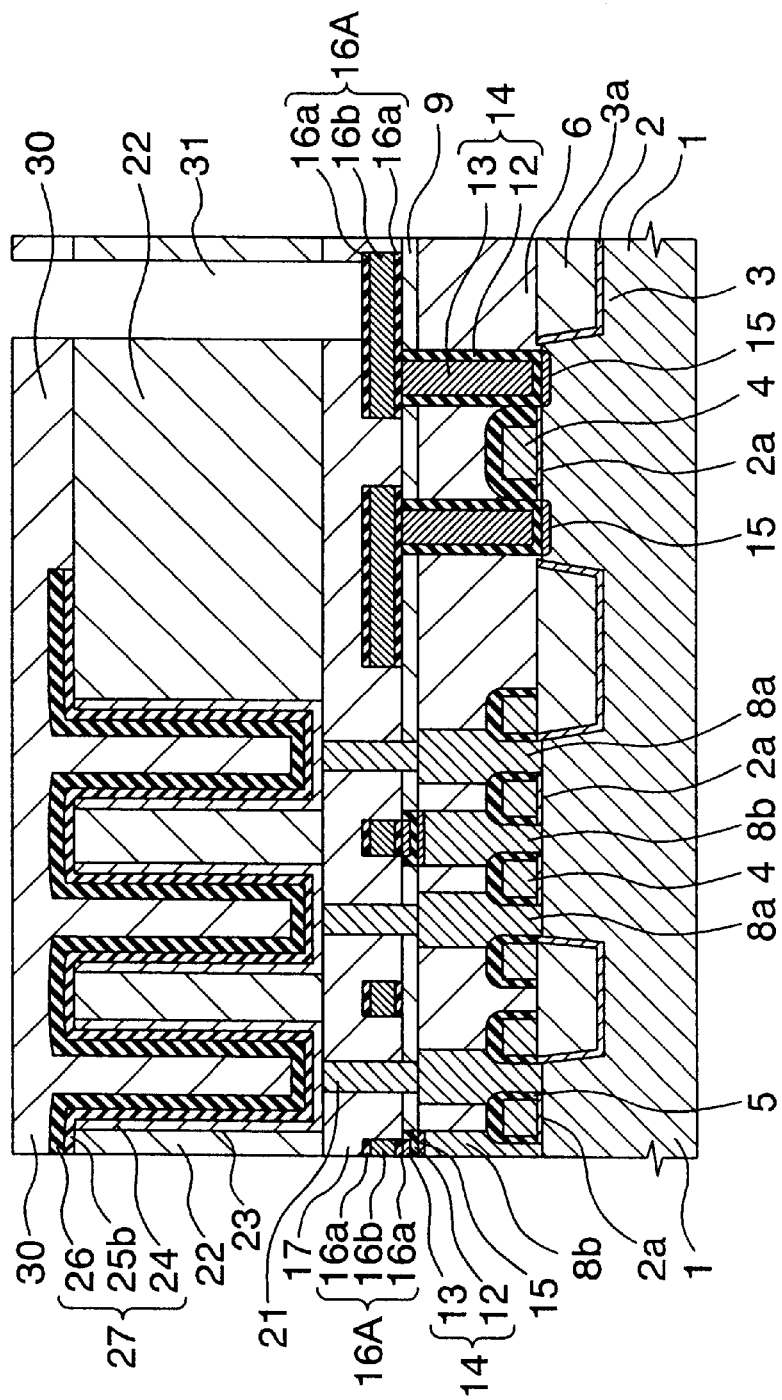
FIG. 8 is a schematic sectional view of a seventh step of the method of producing the semiconductor device related to the embodiment of the invention.

In FIG. 8, a TiN film that serves as the upper electrodes is formed by the CVD method so that it is uniformly deposited along the interior of the capacitor, and a circuit is formed by dry etching. On the surface of the formed upper electrode 26 is formed an interlayer dielectric film 30, and a through hole 31 is formed for providing electric continuity to the circuit surrounding the substrate.

After performing the steps up to the state shown in FIG. 8, there are further performed the steps of: forming a tungsten plug 34 for the electrical connection between the first-layer interconnector 16A and second-layer laminated interconnectors; forming a second-layer layered interconnectors 38a, 38b; forming an interlayer dielectric film 40; forming tungsten plugs 44a, 44b for the electrical connection between the second-layer interconnectors and third-layer interconnectors and between the upper electrode 26 of the capacitor and the third-layer interconnectors forming the third-layer interconnectors 48a, 48b, forming a silicon oxide film 49 and a silicon nitride film 50 that protect the whole of the semiconductor device 100; and forming openings (not shown in the drawings) for the electrical connection to the outside of the semiconductor device 100, whereby the semiconductor device 100 having high reliability is completed even in a case where the fine first-layer interconnector 16A with a width not more than 200 nm is formed on the side of the substrate of the capacitor as shown in FIG. 1.

Figure 9:
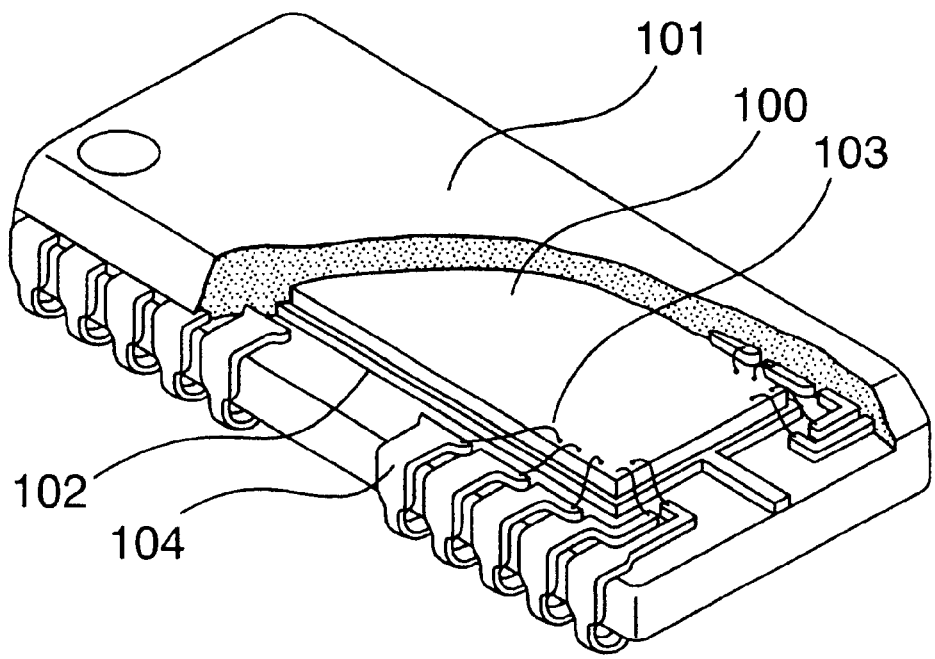
FIG. 9 is a perspective view of the semiconductor device encapsulated with a resin which semiconductor device is related to the embodiment of the invention.

Finally, packaging in a chip size or packaging in a shape as shown in FIG. 9 is applied. FIG. 9 shows an example in which the semiconductor device 100 is encapsulated with a resin 101. The semiconductor device 100 is bonded onto a die electrode, and a bonding wire 103 is connected to the semiconductor device 100. The bonding wire 103 is also connected to a lead frame 104 and performs the input and output of signals to the outside.

Because of these features, the invention can provide a highly reliable semiconductor.

Further, according to the invention, defects such as the break of layered interconnectors can be prevented and the reliability against interconnector breaks in a semiconductor device is greatly improved.

What is claimed:

1. A semiconductor device comprising:

a silicon substrate;

a first interlayer dielectric film covering the silicon substrate;

a first interconnector formed over the first interlayer dielectric film;

a second interlayer dielectric film covering the first interconnector;

a second interconnector formed over the second interlayer dielectric film; and a capacitive element having a first electrode and a second electrode both formed over the silicon substrate, and a dielectric film formed between the first electrode and the second electrode, said first interconnector having a first electrically conductive film, a third electrically conductive film, and a second electrically conductive film provided between the first electrically conductive film and the third electrically conductive film which second electrically conductive film contains tungsten as the main element thereof, each of the first electrically conductive film and the third electrically conductive film containing one element selected from the group consisting of tungsten or molybdenum, said second interconnector containing aluminum.

2. A semiconductor device according to claim 1, wherein each of the first electrically conductive film and the third electrically conductive film contains molybdenum as the main element thereof.

3. A semiconductor device according to claim 1, wherein each of said interconnectors has a width of not less than 200 nanometers.

4. A semiconductor device comprising:

a silicon substrate;

an interlayer dielectric film formed on the silicon substrate; and at least one interconnector formed on the interlayer dielectric film;

said interconnector having a first electrically conductive film, a third electrically conductive film, and a second electrically conductive film provided between the first electrically conductive film and the third electrically conductive film which second electrically conductive film contains tungsten as the main element thereof, each of said first electrically conductive film and said third electrically conductive film containing one element selected from the group consisting of molybdenum and tungsten, said semiconductor device further comprising a plug electrically connecting said interconnector to said silicon substrate, which plug contains tungsten.

5. A semiconductor device according to claim 4, further comprising, over the silicon substrate, a capacitive element having a first electrode electrode, a dielectric film formed on said first electrode, and a second electrode formed on said dielectric film.

6. A semiconductor device according to claim 4, further comprising a plug containing silicon which electrically connects said capacitive element to said silicon substrate.

* * * * *